United States Patent
Su et al.

(10) Patent No.: US 11,812,597 B2
(45) Date of Patent: Nov. 7, 2023

(54) MULTI-LAYER ELECTOMAGNETIC SHIELDING COMPOSITE

(71) Applicants: Toyota Motor Engineering & Manufacturing North America, Inc., Plano, TX (US); Toyota Jidosha Kabushiki Kaisha, Toyota (JP)

(72) Inventors: Xiaoshi Su, Ann Arbor, MI (US); Debasish Banerjee, Ann Arbor, MI (US); Hiroki Nishijima, Nisshin (JP)

(73) Assignees: Toyota Motor Engineering & Manufacturing North America, Inc., Plano, TX (US); Toyota Jidosha Kabushiki Kaisha, Toyota (JP)

( * ) Notice: Subject to any disclaimer, the term of this patent is extended or adjusted under 35 U.S.C. 154(b) by 289 days.

(21) Appl. No.: 17/090,328

(22) Filed: Nov. 5, 2020

(65) Prior Publication Data

US 2022/0142022 A1    May 5, 2022

(51) Int. Cl.
*H05K 9/00* (2006.01)
*B60R 16/02* (2006.01)
*B22F 1/054* (2022.01)

(52) U.S. Cl.
CPC .......... *H05K 9/0088* (2013.01); *B60R 16/02* (2013.01); *B22F 1/054* (2022.01); *B22F 1/0551* (2022.01)

(58) Field of Classification Search
CPC ..... H05K 9/0088; B22F 1/054; B22F 1/0551; B22F 7/04; B60R 16/02; C22C 2202/02
See application file for complete search history.

(56) References Cited

U.S. PATENT DOCUMENTS

| | | | | |
|---|---|---|---|---|
| 9,832,917 | B2* | 11/2017 | Jang | .......................... H01Q 1/52 |
| 2016/0007510 | A1* | 1/2016 | Cheng | .................. H05K 9/0088 |
| | | | | 428/335 |
| 2019/0092641 | A1 | 3/2019 | Soda et al. | |
| 2019/0166733 | A1 | 5/2019 | Gogotsi et al. | |
| 2020/0015391 | A1 | 1/2020 | Lee | |
| 2020/0029477 | A1 | 1/2020 | Soda et al. | |

OTHER PUBLICATIONS

D.D.L. Chung, "Materials for electromagnetic interference shielding" Materials Chemistry and Physics 255 (2020) 123587 (Year: 2020).*

(Continued)

*Primary Examiner* — Brian D Walck
*Assistant Examiner* — Nazmun Nahar Shams
(74) *Attorney, Agent, or Firm* — Christopher G. Darrow; Darrow Mustafa PC (57) ABSTRACT

A multi-layered material is provided for shielding low-frequency electromagnetic waves. The multi-layered material may include a plurality of repeating sets of alternating layers of materials. Each repeating set of alternating layers may include an electrically conductive layer and a magnetic layer including a continuous layer of a magnetic material. The multi-layered material is generally configured to shield electromagnetic waves having a frequency of less than about 1 MHz. In various aspects, the electrically conductive layer may include a conductive metal layer, or a two-dimensional transitional metal carbide. The multi-layered material may be provided as a thin film, or can be shaped or sized as flakes for use with a resin composite that is deposited via a spray application technique.

20 Claims, 6 Drawing Sheets

(56) References Cited

OTHER PUBLICATIONS

1. Lothar O. Hoeft Using unconventional materials for electromagnetic shielding. In: 2013 IEEE Int Symp Electromagn Compat. IEEE; 2013. p. 118-23. ttps://doi.org/10.1109/ISEMC.2013.6670393. (Year: 2013).*

2. Sewoon Kim et.al. "Enhanced adsorption performance for selected pharmaceutical compounds by sonicated Ti3C2TX MXene". (Year: 2021).*

Shahzad et al., "Electromagnetic interference shielding with 2D transition metal carbides (MXenes)", Science Mag., vol. 353, Issue 6304, pp. 1137-1140 (Sep. 9, 2016).

Raagulan et al., "Recent Advancement of Electromagnetic Interference (EMI) Shielding of Two Dimensional (2D) MXene and Graphene Aerogel Composites," Nanomaterials 2020, 10 702 (Apr. 8, 2020), pp. 1-22.

Singh et al., "A review of porous lightweight composite materials for electromagnetic interference shielding," Composites Part B: Engineering, vol. 149 (Sep. 15, 2018) (2 pages) (Abstract).

Han M. et al., "Beyond Ti3C2Tx: Mxenes for Electromagnetic Interference Shielding," ACS Nano 2020 14 (4), pp. 5008-5016 (Abstract).

Li Y. et al., "Facile preparation of in situ coated Ti3C2Tx/Ni0.5Zn0.5Fe2O4 composites and their electromagnetic performance," RSC Adv., 7 (2017) pp. 24698-24708.

He J. et al., "Magnetic FeCo nanoparticles-decorated Ti3C2 MXene with enhanced microwave absorption performance," Journal of Magnetism and Magnetic Materials 492 (2019) 165639 (6 pages).

Xiao Li et al., Supporting Information for "Self-Assembly-Magnetized MXene Avoid Dual-Agglomeration with Enhanced Interfaces for Strong Microwave Absorption through a Tunable Electromagnetic Property", ACS Appl. Mater. Interfaces 2019, 11, 47, 10 pages.

T. Yun et al., "Electromagnetic Shielding of Monolayer MXene Assemblies", Adv. Mater. 2020, 32, 1906769, 9 pages.

Z. Yang et al., "Enhanced Microwave Absorption Properties of Carbon Black/Silicone Rubber Coating by Frequency-Selective Surface", J. Electron. Mater. 45, 5017 (2016) Abstract only.

J. Wu et al., "Combined Use of Magnetic and Electrically Conductive Fillers in a Polymer Matrix for Electromagnetic Interference Shielding", J. Electron. Mater. 37, 1088 (2008) Abstract Only.

S. Varshney et al., "Improved Electromagnetic Shielding Performance of Lightweight Compression Molded Polypyrrole/Ferrite Composite Sheets", J. Electron. Mater. 46, 1811(2017) Abstract only.

* cited by examiner

MULTI-LAYER ELECTOMAGNETIC SHIELDING COMPOSITE

TECHNICAL FIELD

The present disclosure generally relates to electromagnetic shielding and, more particularly, to a multi-layer composite material for shielding electromagnetic waves having a low frequency, such as less than about 1 MHz.

BACKGROUND

The background description provided is to generally present the context of the disclosure. Work of the inventors, to the extent it may be described in this background section, and aspects of the description that may not otherwise qualify as prior art at the time of filing, are neither expressly nor impliedly admitted as prior art against the present technology.

An electronics device that uses, transmits, or distributes electrical energy creates electromagnetic waves, also referred to as electromagnetic interference. Electromagnetic interference is a result of oscillating electric fields and magnetic fields, with waves travelling perpendicular to the direction of propagation. Electromagnetic interference can be detrimental to other electronic devices, potentially leading to degradation or malfunction of devices in certain instances.

A vehicle may have many low frequency noise sources, including motors, power control units, batteries, electrical wires, and the like. These and other electronic devices may radiate low frequency electromagnetic waves having a frequency in the KHz-MHz range. These electromagnetic waves can detrimentally interfere with other vehicular devices, and there is a potential to also negatively impact human health, for example, by interfering with devices that assist with the electronic control of organs, such as an artificial heart. Unwanted interference has previously been shielded using relatively thick and heavy metal shields. The use of copper, a high conductivity material, and nickel, a high permeability material, generally does not offer high shielding effectiveness when normalized to mass or thickness.

An increasing number of electronic devices used in vehicles, especially those that operate at faster speeds and smaller sizes, can potentially increase unwanted electromagnetic interference.

While there appears to have been recent improvements in shielding electromagnetic interference at higher frequencies (GHz range and higher), there remains a need for compact, lightweight, and cost effective materials for shielding low frequency electromagnetic radiation.

SUMMARY

This section generally summarizes the disclosure and is not a comprehensive disclosure of its full scope or all its features.

In one aspect, the present technology provides a multi-layered material for shielding low-frequency electromagnetic waves. The multi-layered material may include a plurality of repeating sets of alternating layers of material. Each repeating set of the alternating layers may include an electrically conductive layer and a magnetic layer that may include a continuous layer of a magnetic material. The multi-layered material is generally configured to shield electromagnetic waves having a low frequency, for example, exhibiting a frequency of less than about 1 MHz. In certain examples, the electrically conductive layer may include a two-dimensional transitional metal carbide.

In another aspect, the present technology provides a sprayable composite composition for shielding low-frequency electromagnetic waves. The composite composition may include a base liquid resin material and a flaked material disposed within the base liquid resin material. The flaked material may include a plurality of repeating sets of alternating layers of material. Each repeating set of alternating layers may include an electrically conductive layer and a magnetic layer. The magnetic layer may be provided as a continuous layer of a magnetic material. Upon application to a substrate or structured component, the composite composition is configured to shield electromagnetic waves having a frequency of less than about 1 MHz.

In still other aspects, the present technology provides a method for forming a composite material for shielding low-frequency electromagnetic waves. The method includes providing a multi-layered material including a plurality of repeating sets of alternating layers of material. Each repeating set of alternating layers includes an electrically conductive layer and a magnetic layer including a continuous layer of a magnetic material. The method includes shaping or sizing the multi-layered material into flakes, and making a homogenous mixture of the flakes of the multi-layered material and a base liquid resin material. The method includes applying the homogenous mixture to a substrate or structured component to form a coating. In various aspects, the coating is configured to shield electromagnetic waves having a frequency of less than about 1 MHz.

Further areas of applicability and various methods of enhancing the disclosed technology will become apparent from the description provided. The description and specific examples in this summary are intended for illustration only and are not intended to limit the scope of the present disclosure.

BRIEF DESCRIPTION OF THE DRAWINGS

The present teachings will become more fully understood from the detailed description and the accompanying drawings, wherein.

The figures set forth herein are intended to exemplify the general characteristics of the methods, algorithms, and devices among those of the present technology, for the purpose of the description of certain aspects. These figures may not precisely reflect the characteristics of any given aspect and are not necessarily intended to define or limit specific embodiments within the scope of this technology. Further, certain aspects may incorporate features from a combination of figures.

DETAILED DESCRIPTION

An effective electromagnetic shielding material should be able to reduce undesirable electromagnetic interference by various mechanisms, including both reflection and absorption of electromagnetic waves and/or the interference. For certain low frequency interference, there may be a need for an emphasis regarding magnetic field shielding. The present technology provides a light weight, multi-layered composite material useful as an electromagnetic shielding material, which also addresses the magnetic field shielding needs that may arise at the lower frequencies.

The multi-layered composite materials of the present technology may be especially useful in vehicles for shielding low frequency electromagnetic waves and electromagnetic interference induced from electric and/or magnetic fields that may originate from one or more electronics devices. In various aspects, the multi-layered composite material may include a plurality of repeating sets of alternating layers of material. Each repeating set of the alternating layers may include an electrically conductive layer and a magnetic layer. As will be discussed in more detail below, the magnetic layers may include a continuous layer of a magnetic material. The multi-layered composite material is generally configured to shield electromagnetic waves having a relatively low frequency, for example, of less than about 1 MHz. In certain aspects, the multi-layered composite material may be configured to shield electromagnetic waves having a frequency of less than about 100 kHz. The electrically conductive layer may include various different materials and configurations to provide high conductivity and, in certain non-limiting aspects, may include a two-dimensional transitional metal carbide. It is contemplated that the multi-layered composite material may be provided as a thin film, or layer, that can be used by itself or in combination with another substrate or structural component. In other uses, the multi-layered composite material can be shaped and/or sized as small fragments, or flakes. In various aspects, the flakes can be mixed with an appropriate base material, such as a liquid resin, in order to form a mixture that can be applied/deposited via a spray application technique, or the like, to form an electromagnetic shield coating, for example, to be applied on one or more shaped vehicle component.

Figure 1:
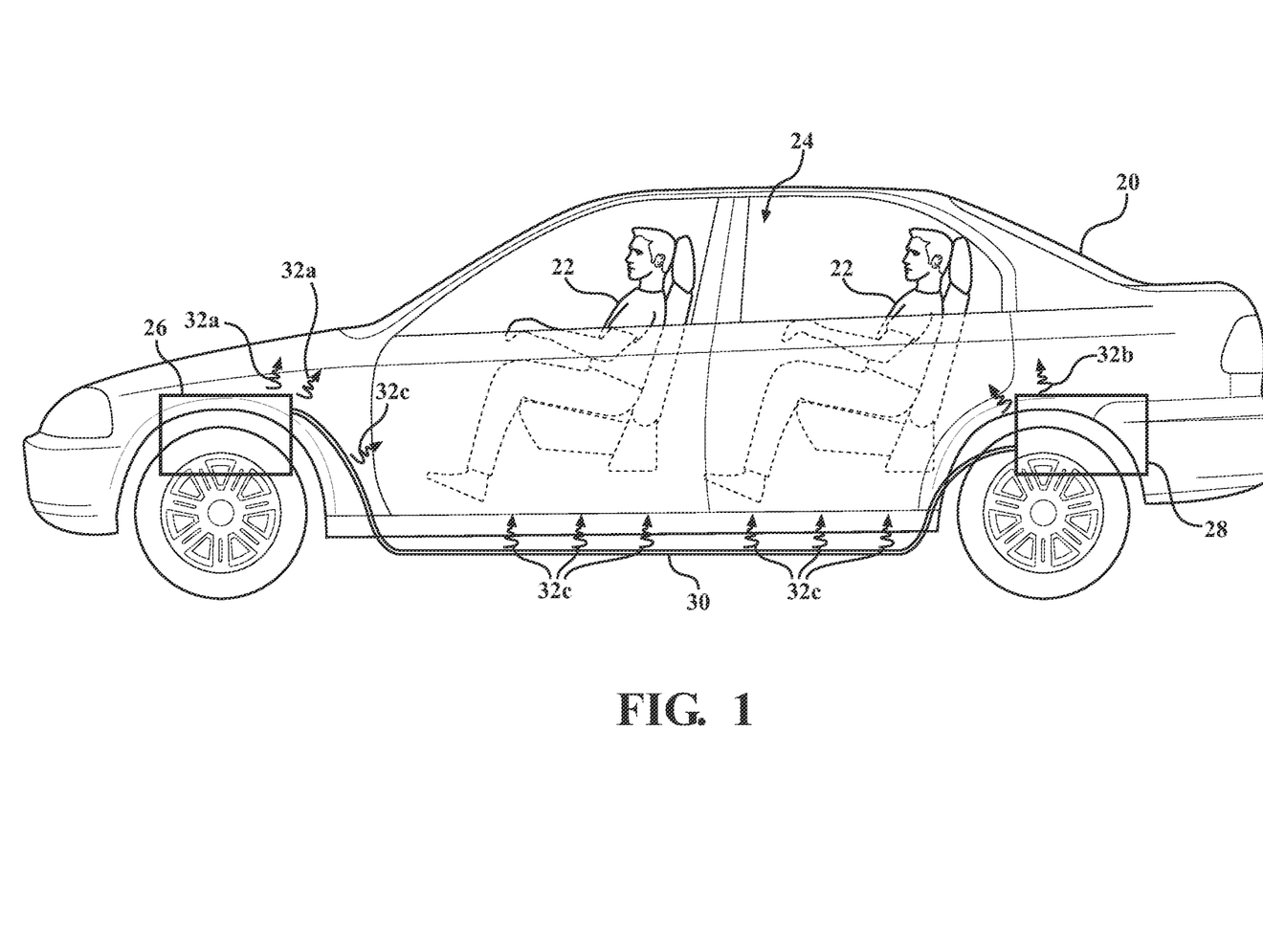
FIG. 1 is a schematic illustration of a vehicle showing electromagnetic radiation emitted from devices such as a power control unit, battery, and electrical lines.

FIG. 1 is a schematic illustration of an exemplary passenger vehicle 20 with front and rear seat occupants 22 within an interior passenger compartment 24. The vehicle 20 may include various components and electronics devices, and is specifically shown with a power control unit 26, a battery 28, and various wires and/or electrical lines 30. For illustration purposes, the power control unit 26, the battery 28, and the electrical lines 30 are shown with electromagnetic waves 32a, 32b, 32c emitted therefrom. It is envisioned that the multi-layered composite materials of the present technology may be used as a thin film, a film assembly, or a coating, serving as an electromagnetic shield for a vehicle component. For example, in various aspects, the multi-layered composite materials could be strategically applied onto any substrate or structural component of the vehicle 20, or could be incorporated with other materials, such as insulation, in order to shield at least a portion of the electromagnetic waves 32a, 32b, 32c from the passenger compartment 24, or other desired interior areas, of the vehicle 20. It should be understood that while various aspects of the present technology may be discussed with reference to electromagnetic shielding applications for use in a vehicle 20, this disclosure is similarly applicable for non-automotive applications, and is not meant to be limited in scope in any manner. For example, the multi-layered composite materials may be used in combination with many forms of a base substrate or similar material, which can be solid or porous, providing an underlying structure capable of supporting the thin film, film assembly, or coating, and serving as an electromagnetic shield.

Figure 2:
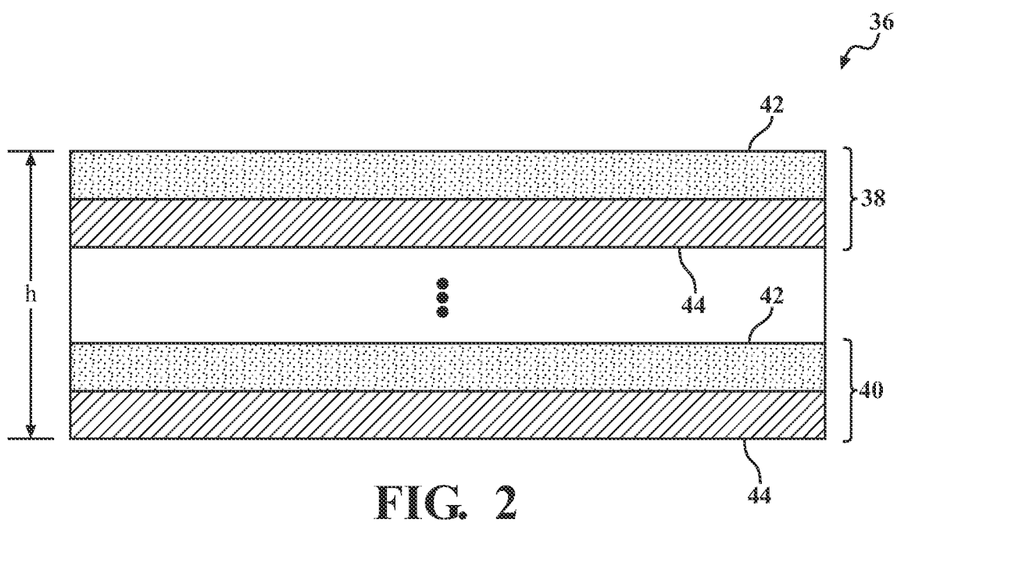
FIG. 2 is a schematic illustration that provides a first exemplary representation of a multi-layered material according to various aspects of the present technology.

FIG. 2 is a schematic illustration that provides a first exemplary representation of a multi-layered material 36 according to various aspects of the present technology. The multi-layered material 36 is specifically shown with a first set 38 of layers of material and a second set 40 of layers of material, with any number of sets of alternating repeating layers located between the first and second sets of layers 38, 40, providing a total thickness, or height dimension, h. While the thickness dimension, h, may vary based on a number of different factors and material properties, in various aspects, the thickness dimension, h, may be less than about 200 µm, less than about 150 µm, less than about 100 µm, or even less than about 75 µm. As shown, each set 38, 40 of layers may include an electrically conductive layer 42 and a magnetic layer 44. The orientation, or order of assembly, of the electrically conductive layer 42 and the magnetic layer 44 within the sets of layers 38, 40 may vary.

Figure 3:
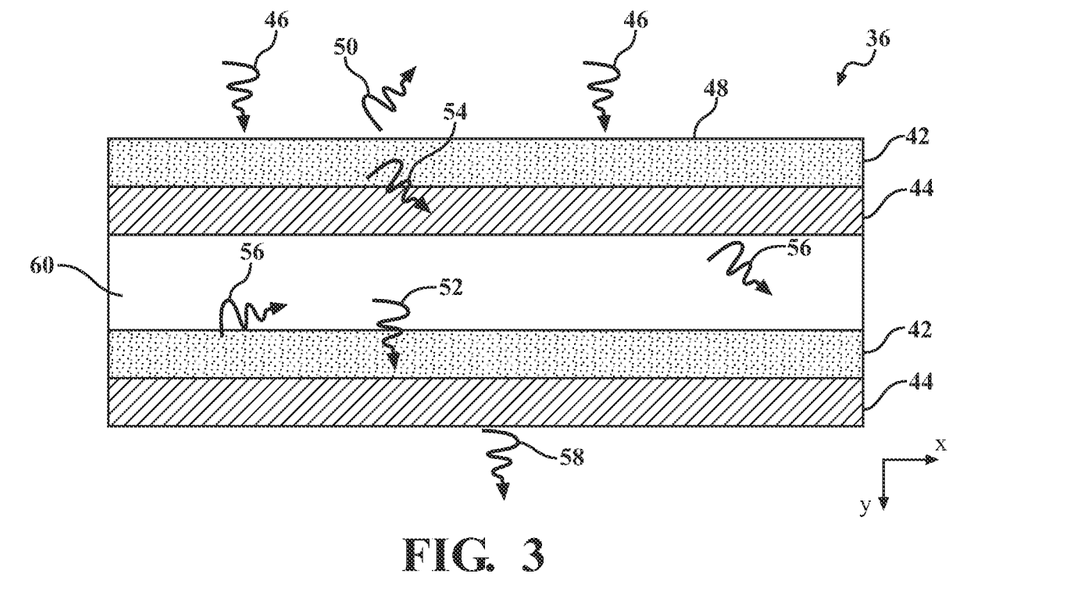
FIG. 3 is a schematic illustration that provides a generalization of the potential shielding mechanisms that may contribute to the shielding properties resulting from the multi-layered material made in accordance with the present technology.

As briefly mentioned above, an effective electromagnetic shielding material should be able to reduce undesirable electromagnetic interference by various mechanisms. It is generally understood that absorption is typically a major or primary shielding mechanism, and reflection may often be a secondary shielding mechanism. The reflection may include single reflections and multiple reflections, as well as interlayer reflections that occur between distinct layers. FIG. 3 is a schematic illustration that provides a generalization of the possible shielding mechanisms that contribute to the shielding properties resulting from the multi-layered materials of the present technology. For example, various incident electromagnetic waves 46 may travel in the "y" direction to make initial contact with a surface 48 of the multi-layered material 36. Portions of the incident wave 46 may immediately reflect from the surface 48 as reflected waves 50, and other portions of the incident wave 46 may travel through various layers as weakened transmitted waves 52, absorbed waves 54, and interlayer reflected waves 56 substantially travelling in the "x" direction. Certain waves may ultimately pass through as exiting waves 58, however, they are likely attenuated with decreased intensity. Without being bound by theory, in addition to the reflection from the electrically conductive layers 42, it is believed that the use of magnetic layers 44 including magnetic materials having a high permeability value can exhibit increased shielding capabilities with respect to magnetic fields, which is particularly of interest when shielding low frequency electromagnetic waves. In particular, an impedance mismatch between the various layers may be important to cause increased internal reflections, which may eventually lead to absorption into the various layers. It is believed that at low frequency, magnetic permeability has a stronger effect.

The electrically conductive components provided in the electrically conductive layers 42 of the multi-layered materials 36 of the present technology preferably have a relatively high degree of conductivity in order to provide charge carriers to interact with electromagnetic fields. Many traditional electrically conductive layers useful with electromagnetic shields include a conducting metal. Thus, in its simplest form, the electrically conductive layers 42 can be provided as a very thin, highly conductive metal such as a metal film, or layer. For example, copper layers disposed between magnetic materials can improve the shielding effectiveness because the conductivity is relatively high. In many examples, each electrically conductive layer 42 can be provided with an atomically thin thickness dimension, as a thin monolayer, or in some examples having a thickness dimension ranging from about 10 μm to about 50 μm. In certain aspects, a higher conductivity of the electrically conductive layer 42 can improve a shielding effectiveness if the thickness dimension is increased. Thus, the electrically conductive layer 42 may function as a conductive spacer. The electrically conductive layers 42 of different sets of layers may generally be provided with the substantially the same thickness dimension. In other aspects, certain electrically conductive layers 42 may be provided with a different thickness dimension. In still other aspects, it is envisioned that the electrically conductive layer 42 can also be provided as a polymer-matrix composite including a conductive material, such as a conductive metal.

As an alternative to a thin metal film or layer, the present technology also provides the use of MXene as the electrically conductive layer 42 of the multi-layered material 36. As is known in the art, MXenes are a family of two-dimensional (2D) transition metal carbides, carbonitrides, and nitrides that have been used in many applications. With respect to electromagnetic shielding, MXenes exhibit good flexibility, are easy to fabricate and process, and exhibit a high conductivity with a minimal thickness. In various aspects, the MXene may be provided as a thin layer or monolayer, for example, a few-atoms-thick layer. In other aspects, the MXene may be provided as a plurality of stacked layers forming the electrically conductive layer 42. With aspects using a plurality of layers, the layers may include the same or different materials and compositions; the layers may also be provided with the same of different thickness dimensions.

As is known in the art, a MXene compound or composition includes a two-dimensional inorganic material, generally arranged as one layer having first and second surfaces. The MXene layer may be a substantially two-dimensional array of crystal cells, with each crystal cell having an empirical formula of: $M_{n+1}X_n$, such that each X is positioned within an octahedral array of M; wherein M is at least one Group IIIB, IVB, VB, or VIB metal; wherein each X is C, N, or a combination thereof; and n=1, 2, or 3.

MXene compositions have been described in various patents and publications, and the various details of the compositions, the electrical properties, and methods of making MXene compositions are not included herein for purposes of brevity. Any known MXene composition should be considered as potentially applicable for use with the present technology. For the sake of completeness, however, M can be at least one of Sc, Y, Lu, Ti, Zr, Hf, V, Nb, Ta, Cr, Mo, or W. Certain of these compositions include those having one or more empirical formula wherein $M_{n+1}X_n$ includes $Sc_2C$, $Ti_2C$, $V_2C$, $Cr_2C$, $Cr_2N$, $Zr_2C$, $Nb_2C$, $Hf_2C$, $Ti_3C_2$, $V_3C_2$, $Ta_3C_2$, $Ti_4C_3$, $V_4C_3$, $Ta_4C_3$, $Sc_2N$, $Ti_2N$, $V_2N$, $Cr_2N$, $Cr_2N$, $Zr_2N$, $Nb_2N$, $Hf_2C$, $Ti_3N_2$, $V_3C_2$, $Ta_3C_2$, $Ti_4N_3$, $V_4C_3$, $Ta_4N_3$ or a combination or mixture thereof. In certain aspects, the $M_{n+1}X_n$ structure includes $Ti_3C_2$, $Ti_2C$, $Ta_4C_3$ or $(V_{1/2}Cr_{1/2})_3C_3$. In certain other aspects, M is Ti or Ta, and n is 1, 2, or 3, for example having an empirical formula $Ti_3C_2$ or $Ti_2C$ and wherein at least one of the surfaces of each layer has surface terminations comprising hydroxide, oxide, sub-oxide, or a combination thereof.

In other aspects, MXene compositions may be provided where each crystal cell has an empirical formula of $M'_2M''_nX_{n+1}$, such that each X is positioned within an octahedral array of M' and M'', and where $M''_n$ is present as an individual two-dimensional array of atoms intercalated (sandwiched) between a pair of two-dimensional arrays of M' atoms, wherein M' and M'' are different Group IIIB, IVB, VB, or VIB metals (including where M' and M'' are Ti, V, Nb, Ta, Cr, Mo, or a combination thereof), wherein each X is C, N, or a combination thereof; and n=1 or 2. For the sake of completeness, in some aspects, M' can be Mo, and M'' can be Nb, Ta, Ti, or V, or a combination thereof. In other aspects, n is 2, M' can be Mo, Ti, V, or a combination thereof, and M'' can be Cr, Nb, Ta, Ti, or V, or a combination thereof. In still other aspects, the empirical formula $M'_2M''_nX_{n+1}$ includes $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, or $V_2TiC_2$, preferably $Mo_2TiC_2$, $Mo_2VC_2$, $Mo_2TaC_2$, or $Mo_2NbC_2$, or their nitride or carbonitride analogs. In still other aspects, $M'_2M''_nX_{n+1}$ includes $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, or $V_2Ti_2C_3$, preferably $Mo_2Ti_2C_3$, $Mo_2V_2C_3$, $Mo_2Nb_2C_3$, $Mo_2Ta_2C_3$, $Ti_2Nb_2C_3$, $Ti_2Ta_2C_3$, or $V_2Ta_2C_3$, or their nitride or carbonitride analogs.

In still other aspects, the present technology may include the use of self-assembly magnetized MXene layers, magnetically doped MXene layers, as well as layers including composite materials of MXene and various magnetic materials, which may provide for a conductive magnetic composite. Non-limiting examples of $Ti_3C_2$ MXene-based composites may include carbon nanotubes-$Ti_3C_2$ MXene; nanocarbon sphere-$Ti_3C_2$ MXene; amorphous carbon-$TiO_2$-$T_3C_2$ MXene; ZnO—$Ti_3C_2$ MXene; $Ni_{0.5}Zn_{0.5}Fe_2O_4$—$Ti_3C_2$ MXene; $Fe_3O_4$—$Ti_3C_2$ MXene; $Ba_3Co_2Fe_{24}O_{41}$—$Ti_3C_2$ MXene; Ni—$Ti_3C_2$ MXene; $Co_3O_4$—$Ti_3C_2$ MXene; $Co_{0.2}Ni_{0.4}Zn_{0.4}Fe_2O_4$—$Ti_3C_2$ MXene; and FeCo-$T_3C_2$ MXene. Various 2-D $Ti_3C_2T_x$ MXenes are also contemplated, where $T_x$ denotes a surface terminated group, such as —OH, =O, and —F, after etching.

The magnetic layers 44 of the multi-layered material 36 may be disposed directly adjacent to the respective electrically conductive layer 42 of the sets 38, 40 of alternating layers. Similarly, the sets of layers 38, 40 of alternating layers may be disposed directly adjacent to one another. In certain aspects, however, there may optionally be small, discontinuous gaps or pockets 60 (FIG. 3) between certain sets 38, 40 of alternating layers. In various aspects, the magnetic layers 44 include at least one magnetic material such that the magnetic layer 44 exhibits a relative magnetic permeability, which is the measure of the resistance of the material against the formation of a magnetic field, of generally greater than one, greater than 10, greater than 100, and typically may be in a range of from about 100 up to about 1,000,000, depending on the material. Permeability is typically measured in H/m (Henries/m) or Newtons/ampere$^2$ (N/A$^2$).

Non-limiting exemplary materials that may be included in the magnetic layers 44 include various ferromagnetic metals, such as Fe, Ni, Co, as well as with combinations of Si, Bi, K, Cu, Zn, Mn, and the like. By way of example, specific materials may include neodymium magnets, austenitic stainless steel, martensitic stainless steel (hardened or annealed), carbon steel, carbonyl iron powder compounds, silicon iron powder compounds, iron powder compounds, Al—Si—Fe powder compounds (Sendust), nickel iron powder compound, Mo—Fe—Ni powder compound (molypermalloy powder, MPP), ferrite (cobalt, nickel, zinc; magnesium, manganese, zinc; nickel, zinc; manganese, zinc), ferritic stainless steel (hardened), electrical steel, iron (99.8% pure), cobalt-iron, Mu-metal, NANOPERM®, permalloy, iron (99.95% pure Fe annealed in H), Metglas 2714A (annealed), NANOMET®, and combinations thereof.

In various aspects, the magnetic layer 44 may be provided as a dense, continuous layer of material, which is considered to be distinct from a non-continuous layer that may include isolated magnetic particles. The continuous layer of material may include magnetic particles having a particle size with a major dimension measured in the nanometer range, which may be referred to herein as magnetic nanoparticles. In various aspects, the continuous layer of the magnetic material may include a solid layer of magnetic nanoparticles. Such a continuous layer of the magnetic material may be formed using various known techniques, including deposition and chemical techniques. In certain examples, the continuous layer of the magnetic material may include annealed magnetic nanoparticles, and the layer may be formed using an annealing process that fuses magnetic nanoparticles together. The thickness dimension of the magnetic layer may vary based on the material selection, and desired properties, and may range from about 1 μm to about 200 μm, from about 10 μm to about 100 μm, or from about 30 μm to about 50 μm. Thus, in various aspects, a ratio of a thickness dimension of the electrically conductive layer 42 to a thickness dimension of the magnetic layer 44 may vary, and can be within a broad range of from about 1:0.01 to about 1:1,000. In other aspects, a ratio of the thickness dimension of the electrically conductive layer 42 to the thickness dimension of the magnetic layer 44 may be from about 1:1 to about 1:4. The magnetic layers 44 of different sets of layers may generally be provided with the substantially the same thickness dimension. In other aspects, certain magnetic layers 44 may be provided with a different thickness dimension.

Figure 4A:
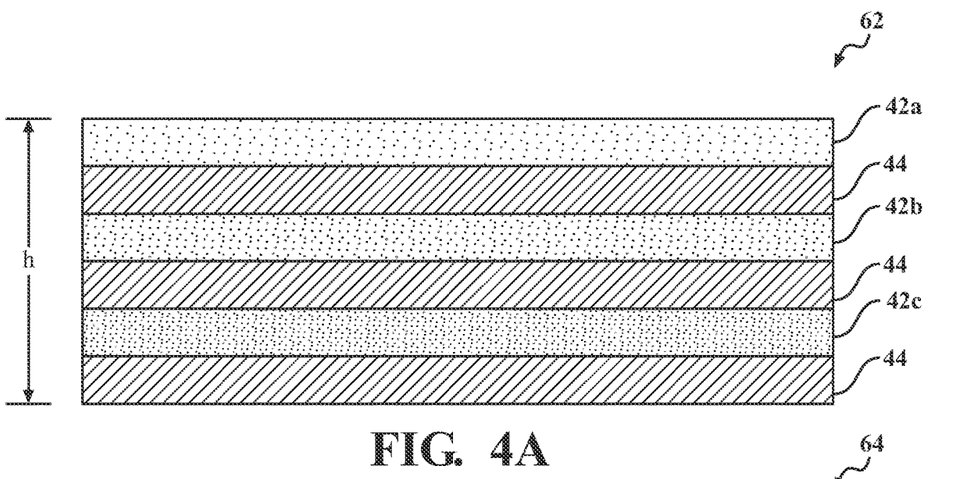
FIGS. 4A-4C are schematic illustrations that provide additional exemplary representations of a multi-layered material according to aspects of the present technology that may use different materials in certain layers.
Figure 4B:
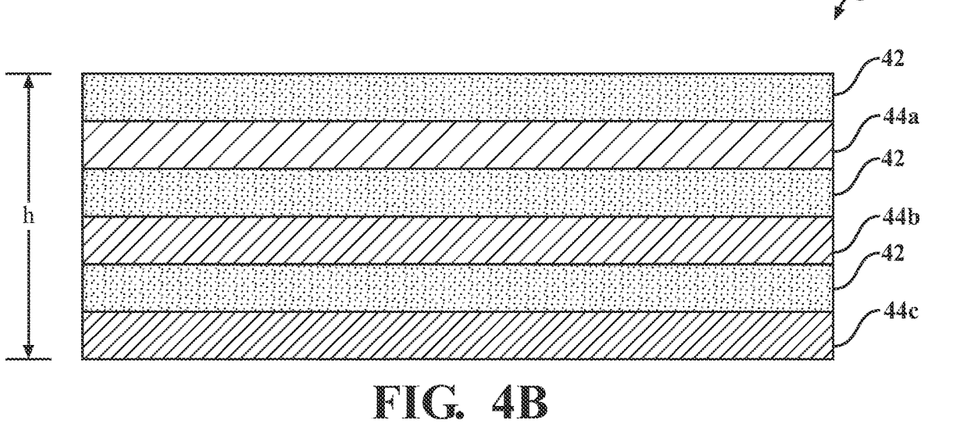
Figure 4C:
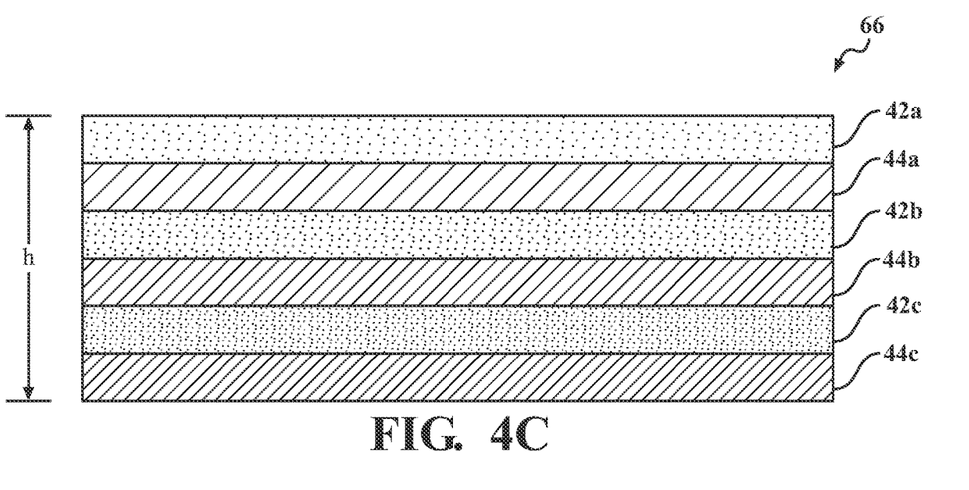

FIGS. 4A-4C are schematic illustrations that provide additional exemplary representations of multi-layered materials according to aspects of the present technology that may use different materials or different compositions in certain layers. The use of different materials in one or more of the different layers may influence a difference in impedance values, which may in turn influence different electromagnetic shielding characteristics, such as increased reflection. For example, the multi-layered material may be provided with a first set of alternating layers with a first electrically conductive layer and a first magnetic material; and a second set of alternating layers with a second electrically conductive layer, different from the first electrically conductive layer, and a second magnetic material, different from the first magnetic material. FIGS. 4A-4C provide non-limiting example configurations of multi-layered composite materials provided with sets of alternating layers including different materials.

As shown in FIG. 4A, the multi-layered material 62 is specifically provided with three sets of alternating layers. Each set may include an electrically conductive layer 42a, 42b, 42c provided with a different material composition, while the magnetic layers 44 are each provided with the same material composition. As shown in FIG. 4B, the multi-layered material 64 is also provided with three sets of alternating layers, however, each set may provide each conductive layer 42 with the same material composition, while each set includes a magnetic layer 44a, 44b, 44c provided with a different material composition. As shown in FIG. 4C, the multi-layered material is provided with three sets of alternating layers, with three different materials in the electrically conductive layers 42a, 42b, 42c, and three different materials in the magnetic layers 44a, 44b, 44c.

The multi-layered composite materials of the present technology can also be used with additional conductive fillers as are known in the art to further influence the shielding of electromagnetic interference. Non-limiting examples may include various carbon nanotubes, carbon nanofibers, graphene, and the like.

In aspects where it may not be feasible to utilize the multi-layered composite material as a thin film, which in certain instances may be too fragile for a particular use, the present technology also contemplates the multi-layered composite material being shaped and/or sized as small fragments, or flakes. In various aspects, the flakes can be mixed with an appropriate base material, such as a liquid resin, in order to form a mixture that can be applied/deposited via a spray application technique, or the like, to form an electromagnetic shield coating, for example, to be applied on one or more vehicle component, which may have a complex or three-dimensional shape.

Figure 5:
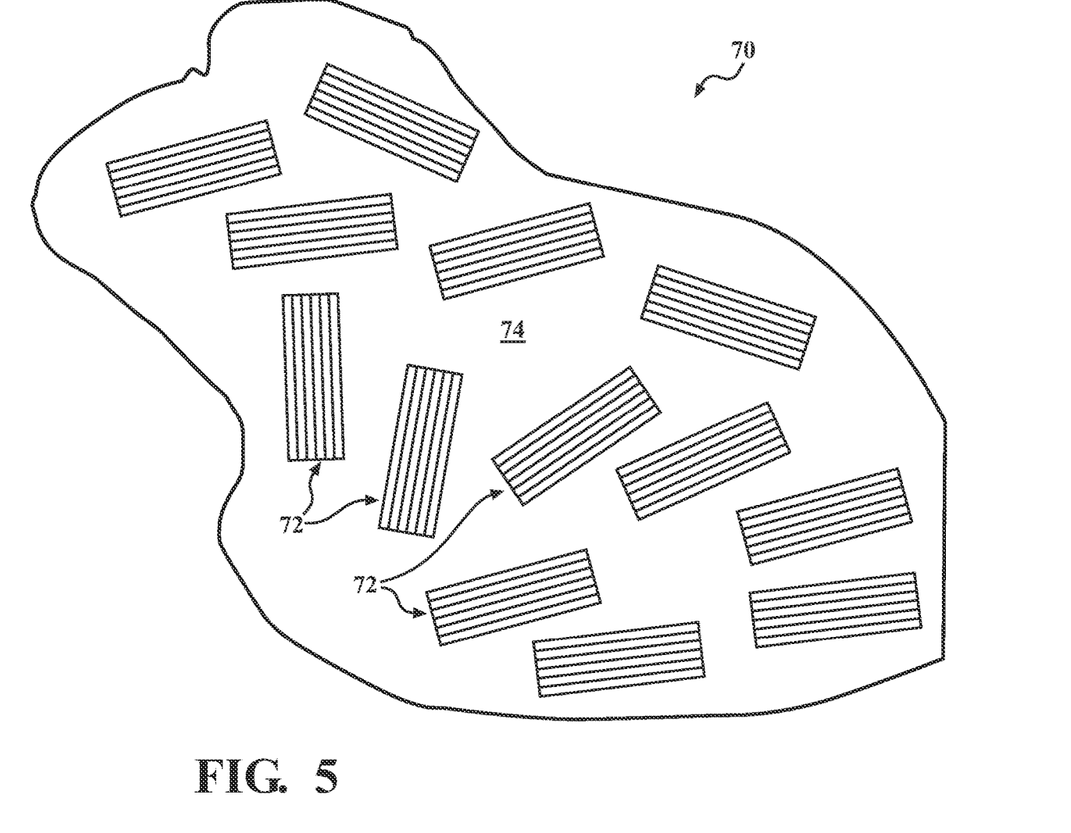
FIG. 5 is a schematic illustration that provides an exemplary representation of a coating including fragments or flakes of a multi-layered material according to various aspects of the present technology.

FIG. 5 is a schematic illustration that provides an exemplary representation of a resulting coating 70 including fragments or flakes 72 of a multi-layered material disposed in a resin 74 according to various aspects of the present technology. An exemplary sprayable composite composition may include any suitable base liquid resin material with the small fragments, or flakes 72 provided as a substantially homogenous mixture disposed within the base liquid resin material. The dimensions of the flakes 72, also referred to as the flaked material, may vary based on the specific application and desired properties. In various aspects, one or more surface dimension of the flaked material may range from about 5 μm to about 100 μm. In certain instances, the flakes 72 may have substantially uniform dimensions, while it other aspects, it may be desirable to include flakes 72 with a mixture of having different size dimensions, for example, different aspect ratios of height:width. The flakes 72 may also be provided with different types and combinations of materials. The flaked material may include a plurality of repeating sets of alternating layers of material as discussed above. For example, each repeating set of alternating layers may include an electrically conductive layer and a magnetic layer, and the magnetic layer may be provided as a continuous layer of a magnetic material. It should be understood that while the flakes 72 of FIG. 5 are generally illustrated as rectangular shaped, the geometry of the flakes may be substantially more random, with different dimension as well as various alignments within the resin 74. Upon application of the composite material to a substrate or structured component as a coating, which may be deposited using any known spray application technique suitable with these materials, the coating composite composition may be configured to shield electromagnetic waves having a frequency of less than about 1 MHz.

The present technology additionally provides methods for forming a composite material for shielding low-frequency electromagnetic waves. The methods may include providing a multi-layered material including a plurality of repeating sets of alternating layers of material as discussed above. For example, each repeating set of alternating layers includes an electrically conductive layer and a magnetic layer that may include a continuous layer of a magnetic material. The methods include shaping or sizing the multi-layered material into flakes, and then making a homogenous mixture of the flakes of the multi-layered material and a suitable base, such as a liquid resin material. The method includes applying the homogenous mixture to a substrate or structured component to form one or more coatings of films. In various aspects, the resulting coating is configured to shield electromagnetic waves having a frequency of less than about 1 MHz Examples Various aspects of the present disclosure are further illustrated with respect to the following Examples. It is to be understood that these Examples are provided to illustrate specific aspects of the present disclosure and should not be construed as limiting the scope of the present disclosure in or to any particular aspect.

Figure 6A:
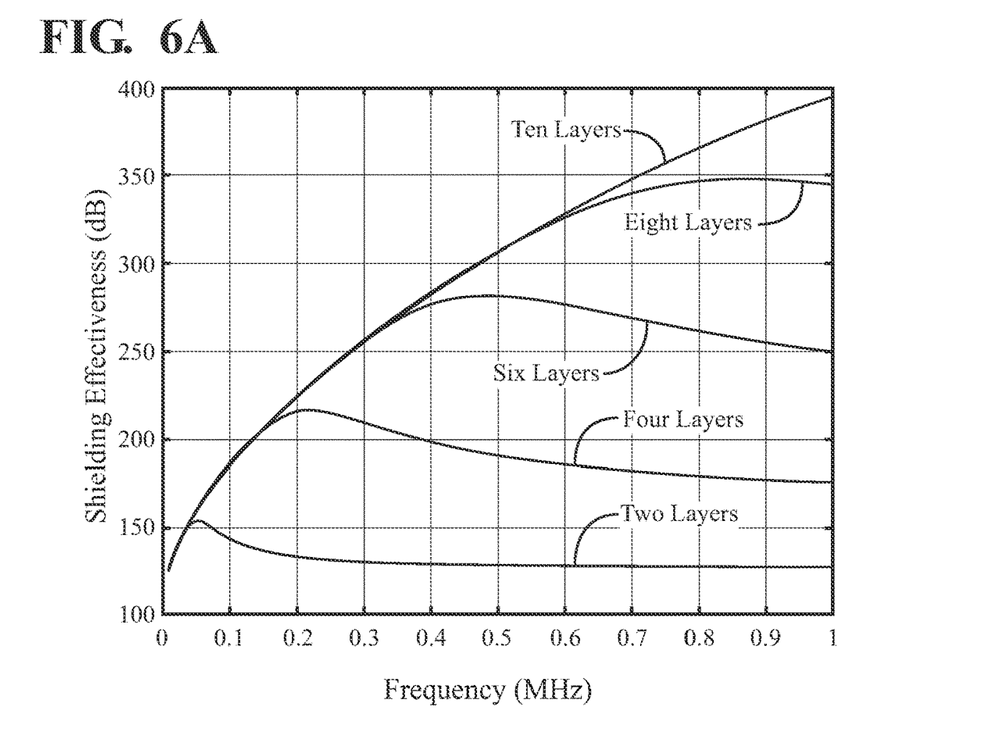
FIGS. 6A-6C illustrate an exemplary plot of frequency vs shielding effectiveness for a far-field simulation for multi-layered materials having various numbers of layers and fixed total thicknesses.
Figure 6B:
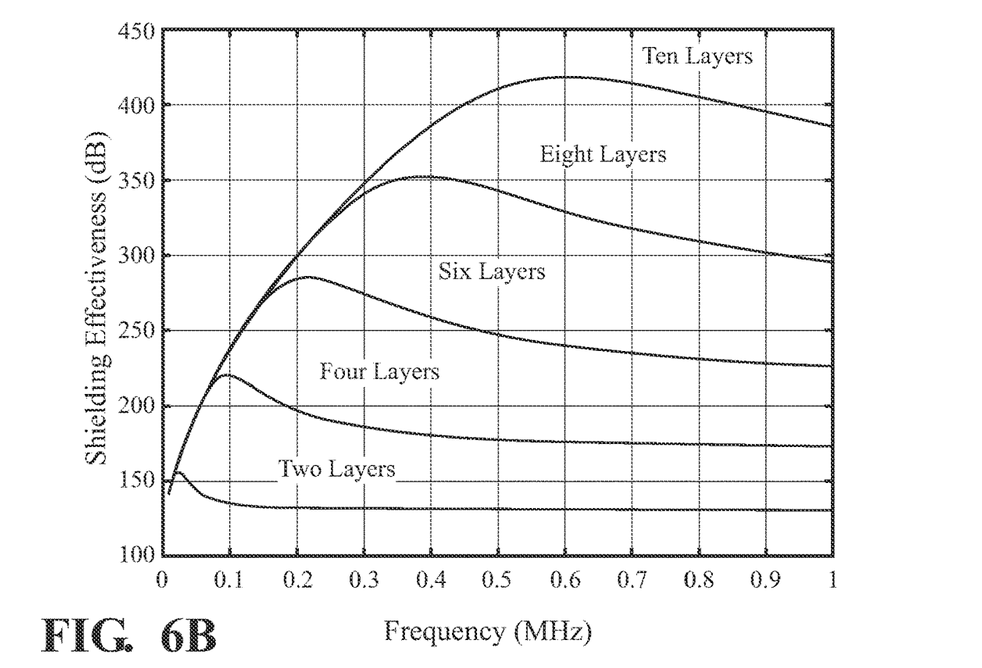
Figure 6C:
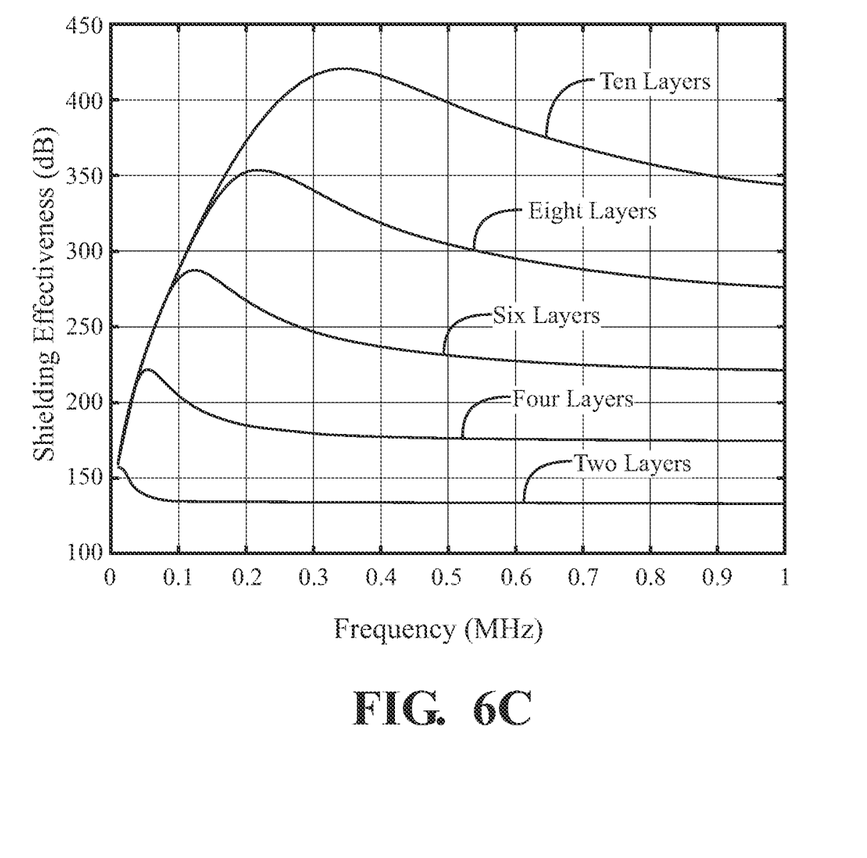

FIGS. 6A-6C each illustrate an exemplary plot of frequency (MHz) vs. shielding effectiveness (dB) for a far-field simulation using a set of multi-layered materials. Each figure compares a difference in the number of sets of repeating layers provided (for example, between 2-10 layers, or 1-5 sets or repeating layers), but having the same fixed total thickness, h. FIG. 6A illustrates data for a first set of 5 multi-layered materials, where the total thickness, h, is 100 µm for each multi-layered material. FIG. 6B illustrates data for a second set of 5 multi-layered materials, where the total thickness, h, is 150 µm for each multi-layered material. FIG. 6C illustrates data for a third set of 5 multi-layered materials, where the total thickness, h, is 200 µm for each multi-layered material. The properties used in the simulations included repeating sets of alternating layers of: an electrically conductive layer having a permittivity of 22, a permeability of 1, and a conductivity of $5e^5$ S/m; and a magnetic layer having a permittivity of 1, a permeability of $2.7e^3$, and a conductivity of $5e^7$ S/m. The skin depth is 225 µm at 0.1 MHz. The simulation data confirms the effect of multi-layering is demonstrated below the skin depth. While the number of alternating layers does have an effect on the electromagnetic shielding, it was discovered that the material properties of the multi-layered materials, such as a higher permeability of the magnetic layer, has a larger influence on the shielding effectiveness. Additionally, the use of a combination of different materials in the various electrically conductive layers and magnetic layers may influence the impedance of the multi-layered materials, which may also increase the shielding effectiveness.

The shielding effectiveness can be considered analogous to a measurement of electromagnetic interference shielding efficiency, which is a term used to characterize the ability of materials to block electromagnetic waves. The total electromagnetic interference shielding efficiency can be considered as the sum of absorption shielding efficiency, reflection shielding efficiency, and multiple internal reflection shielding efficiency. When the electromagnetic interference shielding efficiency value is high, the contribution of multiple internal reflections is combined in the absorption, because the re-reflected waves are absorbed (due to internal reflections) or dissipated as heat in the shielding material.

Apart from reflection and absorption, multiple reflection is also a shielding mechanism, which refers to reflections at various surfaces or interfaces within the material. However, the multiple reflections loss can be neglected when the distance between the reflecting surfaces or interfaces is larger than the skin depth. The electric field of plane wave penetrating the conductor decreases exponentially as the increasing depth of the incoming conductor, so that the electromagnetic wave only penetrates the near surface area of the electrical conductor. The depth at which the field strength drops to 1/e of the incident value is called the skin depth:

$$\delta = (\pi f \mu \sigma)^{-1}$$

where f is frequency, µ is magnetic permeability ($\mu = \mu_o \mu_r$), $\mu_o$ equals to $4 \times 10^{-7}$ H/m, $\mu_r$ is the relative magnetic permeability, and a is electrical conductivity. Therefore, the skin depth decreases as the frequency, conductivity or permeability increases. The use of the multilayer materials of the present technology breaks the skin depth limit, where shielding beyond this limit is generally provided from the internal reflections.

The preceding description is merely illustrative in nature and is in no way intended to limit the disclosure, its application, or uses. As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should also be understood that the various method steps discussed herein do not have to be carried out in the same order as depicted, and not each method step is required in each aspect or embodiment.

The foregoing description of the embodiments has been provided for purposes of illustration and description. It is not intended to be exhaustive or to limit the disclosure. Individual elements or features of a particular embodiment are generally not limited to that particular embodiment but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. A multi-layered material for shielding low-frequency electromagnetic waves, the multi-layered material comprising:
   a plurality of repeating sets of alternating layers of material, each repeating set of alternating layers comprising:
   an electrically conductive layer consisting of a two-dimensional transitional metal carbide (MXene) layer; and
   a magnetic layer comprising a continuous layer of a magnetic material in direct and continuous contact with the electrically conductive layer,
   wherein the multi-layered material is configured to shield electromagnetic waves having a frequency of less than about 1 MHz.

2. The multi-layered material according to claim 1, wherein each of the plurality of repeating sets of alternating layers consists of two layers.

3. The multi-layered material according to claim 1, wherein a single magnetic layer is disposed between a pair of adjacent electrically conductive layers.

4. The multi-layered material according to claim 1, wherein a total thickness dimension of the plurality of repeating sets of alternating layers of material is less than about 200 µm.

5. The multi-layered material according to claim 1, wherein a total thickness dimension of the plurality of repeating sets of alternating layers of material is less than about 150 µm.

6. The multi-layered material according to claim 1, wherein each electrically conductive layer has a thickness dimension of from about 10 µm to about 50 µm.

7. The multi-layered material according to claim 1, wherein the multi-layered material is configured to shield electromagnetic waves having a frequency of less than about 100 kHz.

8. The multi-layered material according to claim 1, wherein the continuous layer of the magnetic material comprises annealed magnetic nanoparticles.

9. The multi-layered material according to claim 1, wherein the continuous layer of the magnetic material comprises a solid layer of magnetic nanoparticles.

10. The multi-layered material according to claim 1, wherein the continuous layer of the magnetic material exhibits a magnetic permeability number of from about 100 to about 1,000,000.

11. The multi-layered material according to claim 1, comprising a first set of alternating layers with a first electrically conductive layer and a first magnetic material; and a second set of alternating layers with a second electrically conductive layer, different from the first electrically conductive layer, and a second magnetic material, different from the first magnetic material.

12. A vehicle component with an electromagnetic shield comprising the multi-layered material according to claim 1.

13. The multi-layered material according to claim 1, wherein a total thickness dimension of the plurality of repeating sets of alternating layers of material is less than about 200 µm.

14. The multi-layered material according to claim 1, wherein a total thickness dimension of the plurality of repeating sets of alternating layers of material is less than about 150 µm.

15. The multi-layered material according to claim 1, wherein each electrically conductive layer has a thickness dimension of from about 10 µm to about 50 µm.

16. The multi-layered material according to claim 1, wherein the multi-layered material is configured to shield electromagnetic waves having a frequency of less than about 100 kHz.

17. The multi-layered material according to claim 1, wherein the continuous layer of the magnetic material comprises annealed magnetic nanoparticles.

18. The multi-layered material according to claim 1, wherein the continuous layer of the magnetic material comprises a solid layer of magnetic nanoparticles.

19. The multi-layered material according to claim 1, wherein the continuous layer of the magnetic material comprises exhibits a magnetic permeability number of from about 100 to about 1,000,000.

20. A multi-layered material for shielding low-frequency electromagnetic waves, the multi-layered material comprising:
   a plurality of repeating sets of alternating layers of material, each repeating set of alternating layers comprising:
   an electrically conductive layer comprising a two-dimensional transitional metal carbide; and
   a magnetic layer comprising a continuous layer of a magnetic material, wherein the multi-layered material is configured to shield electromagnetic waves having a frequency of less than about 1 MHz.

* * * * *